United States Patent
Tsuruda et al.

[11] Patent Number: 6,137,719
[45] Date of Patent: Oct. 24, 2000

[54] NONVOLATILE SEMICONDUCTOR MEMORY DEVICE STORING MULTI-BIT DATA

[75] Inventors: Takahiro Tsuruda; Akira Hosogane, both of Hyogo, Japan

[73] Assignee: Mitsubishi Denki Kabushiki Kaisha, Tokyo, Japan

[21] Appl. No.: 09/431,089

[22] Filed: Nov. 1, 1999

[30] Foreign Application Priority Data

May 21, 1999 [JP] Japan .................................. 11-141400

[51] Int. Cl.[7] .................................................. G11C 16/04
[52] U.S. Cl. ................................ 365/185.03; 365/185.21
[58] Field of Search ...................... 365/185.03, 185.21, 365/185.23, 189.05, 230.08

[56] References Cited

U.S. PATENT DOCUMENTS

| | | | |
|---|---|---|---|
| 5,530,955 | 6/1996 | Kaneko | 365/189.05 |
| 5,969,985 | 10/1999 | Tanaka et al. | 365/185.03 |
| 5,982,667 | 11/1999 | Jyouno et al. | 365/185.03 |
| 6,026,014 | 2/2000 | Sato et al. | 365/185.24 |

FOREIGN PATENT DOCUMENTS 9-297996  11/1997  Japan .
10-233096  9/1998  Japan .

OTHER PUBLICATIONS

"A 256Mb Multilevel Flash Memory with 2MB/s Program Rate for Mass Storage Applications", A. Nozoe et al., ISSCC 1999, Digest of Technical Papers, pp. 110–111.

*Primary Examiner*—Trong Phan
*Attorney, Agent, or Firm*—McDermott, Will & Emery

[57] ABSTRACT

A data latch circuit group latches data read by a sense latch circuit group when a read voltage is supplied to a word line. These data are transferred to a read data conversion circuit and converted to 2-bit data. Thus, no operation processing may be performed through a bit line or a transistor in a memory cell array, whereby a read time can be reduced for reducing power consumption.

8 Claims, 6 Drawing Sheets

| UL | DL1 | DL2 | DL3 |
|----|-----|-----|-----|
| 01 | 1 | 1 | 1 |
| 00 | 1 | 1 | 0 |
| 10 | 1 | 0 | 0 |
| 11 | 0 | 0 | 0 |

| UL | DL1 | DL2 | DL3 |
|----|-----|-----|-----|
| 01 | 0 | 0 | 0 |
| 00 | 0 | 0 | 1 |
| 10 | 0 | 1 | 1 |
| 11 | 1 | 1 | 1 |

TRUTH TABLE OF OPERATION
PROCESSING FOR ADDITIONAL WRITING

| DL1 | DL2 | DL3 | U | L | DL11 | DL21 | DL31 |
|-----|-----|-----|---|---|------|------|------|
| 1 | 1 | 1 | 0 | 1 | 0 | 0 | 0 |
| 1 | 1 | 0 | 0 | 1 | 0 | 0 | 0 |
| 1 | 0 | 0 | 0 | 1 | 0 | 0 | 0 |
| 0 | 0 | 0 | 0 | 1 | 0 | 0 | 0 |
| 1 | 1 | 1 | 0 | 0 | 0 | 0 | 0 |
| 1 | 1 | 0 | 0 | 0 | 0 | 0 | 1 |
| 1 | 0 | 0 | 0 | 0 | 0 | 0 | 1 |
| 0 | 0 | 0 | 0 | 0 | 0 | 0 | 1 |
| 1 | 1 | 1 | 1 | 0 | 0 | 0 | 0 |
| 1 | 1 | 0 | 1 | 0 | 0 | 0 | 1 |
| 1 | 0 | 0 | 1 | 0 | 0 | 1 | 1 |
| 0 | 0 | 0 | 1 | 0 | 0 | 1 | 1 |
| 1 | 1 | 1 | 1 | 1 | 0 | 0 | 0 |
| 1 | 1 | 0 | 1 | 1 | 0 | 0 | 1 |
| 1 | 0 | 0 | 1 | 1 | 0 | 1 | 1 |
| 0 | 0 | 0 | 1 | 1 | 1 | 1 | 1 |

NONVOLATILE SEMICONDUCTOR MEMORY DEVICE STORING MULTI-BIT DATA

BACKGROUND OF THE INVENTION

1. Field of the Invention

The present invention relates to a nonvolatile semiconductor memory device, and more specifically, it relates to a nonvolatile semiconductor memory device storing data of at least two bits in a single memory cell.

2. Description of the Background Art

The capacity of a flash memory is increased by a refinement technique or a multilevel storage technique. The importance of the multilevel storage technique for storing data of at least two bits in a single memory cell is conceivably increased in the future as the storage capacity is increased.

A multilevel storage flash memory storing data of two bits in a single memory cell supplies a read voltage to a word line a plurality of times in order to read data from a memory cell, and supplies a write voltage a plurality of times for writing data in the memory cell. Therefore, this type of flash memory requires a longer time for first access or writing as compared with a flash memory storing data of one bit in a single memory cell.

"A 256 MB Multilevel Flash Memory with 2 MB/s Program Rate for Mass Storage Applications" by Nozoe et al., ISSCC 1999, Digest of Technical Papers, pp. 110 to 111 discloses a quadrilevel flash memory storing data of two bits in a single memory cell. Each memory cell selectively holds four types of levels for storing data of two bits. This flash memory includes a word decoder selectively applying a voltage of 2.4 V, 3.2 V or 4.0 V to a word line, a sense latch circuit arranged at the center of a memory cell array and connected with a pair of bit lines provided on both sides, an upper data latch circuit arranged on one side of the memory cell array and connected with the pair of bit lines, and a lower data latch circuit arranged on another side of the memory cell array and connected with the pair of bit lines. The voltage of 2.4 V is applied to the word line, and data thereby read on the pair of bit lines is first latched by the sense latch circuit, and then transferred to the upper data latch circuit through the pair of bit lines. The voltage of 3.2 V is applied to the word line, and data thereby read on the pair of bit lines is first latched by the sense latch circuit, and then transferred to the lower data latch circuit through the pair of bit lines. The voltage of 4.0 is applied to the word line, and data thereby read on the pair of bit lines is latched by the sense latch circuit. Then, the exclusive OR of the data latched by the sense latch circuit and the data latched by the upper data latch circuit is operated and the result rewritten back in the upper data latch circuit. Finally, the data latched by the upper data latch circuit and the lower data latch circuit are output as read data of two bits.

The aforementioned flash memory transfers the data through the pair of bit lines and employs the pair of bit lines for operating the exclusive OR, and hence the read time is lengthened to disadvantageously increase power consumption. Further, it is difficult to expand such a quadrilevel flash memory storing data of two bits in a single memory cell to an octalevel flash memory storing data of three bits in a single memory cell or a 16-level flash memory storing data of four bits in a single memory cell.

SUMMARY OF THE INVENTION

An object of the present invention is to provide a nonvolatile semiconductor memory device which can reduce the time required for readout/writing.

The nonvolatile semiconductor memory device according to the present invention comprises a memory cell array, a plurality of word lines, a plurality of pairs of bit lines, a word line driver, a sense latch circuit group, ($2^n-1$) data latch circuit groups and a read data conversion circuit. The memory cell array has a plurality of memory cells arranged in rows and columns, each storing data of n (n: integer of at least two) bits. The plurality of word lines are arranged in rows, and each word line is connected with a control gate of the memory cell arranged on the corresponding row. The plurality of pairs of bit lines are arranged in columns, and each pair of bit lines are connected with a drain of the memory cell arranged on the corresponding column. The word line driver selectively supplies ($2^n-1$) types of read voltages to the word lines in readout. The sense latch circuit group latches data of the plurality of pairs of bit lines. Each of the data latch circuit groups latches data latched by the sense latch circuit group when the word line driver supplies the corresponding one of the ($2^n-1$) types of read voltages to the word lines. The read data conversion circuit converts the data latched by the data latch circuit group to data of n bits and reads the data.

The aforementioned nonvolatile semiconductor memory device is provided with the ($2^n-1$) data latch circuit groups, and hence the read data conversion circuit can perform conversion to data of n bits without employing the pairs of bit lines or transistors in the memory cell array. Thus, the time required for reading data from the memory cell can be reduced.

Preferably, the aforementioned nonvolatile semiconductor memory device further comprises a write data conversion circuit and a write circuit. The ($2^n-1$) data latch circuit groups latch data of ($2^n-1$) bits respectively. The write data conversion circuit converts data to be written in the memory cell to data of ($2^n-1$) bits indicating whether or not to supply ($2^n-1$) types of write voltages. The write circuit supplies the ($2^n-1$) types of write voltages to the memory cell in response to the data latched by the ($2^n-1$) data latch circuit groups.

In the aforementioned nonvolatile semiconductor memory device, the data latch circuit groups latch the data of ($2^n-1$) bits, and hence the write data conversion circuit can convert data without employing the pairs of bit lines or the transistors in the memory cell array. Thus, the time required for writing data in the memory cell can be reduced.

Preferably, the aforementioned plurality of pairs of bit lines are arranged in an open structure. The aforementioned sense latch circuit group is aligned perpendicularly to the plurality of pairs of bit lines. The data latch circuit groups are aligned perpendicularly the plurality of pairs of bit lines. The sense latch circuit group and the data latch circuit groups are adjacent to each other.

In the aforementioned nonvolatile semiconductor memory device, the plurality of pairs of bit lines are arranged in an open structure, and hence the sense latch circuit group and the data latch circuit groups can be aligned perpendicularly to the plurality of pairs of bit lines. Further, the sense latch circuit group and the data latch circuit groups are adjacent to each other, whereby the overall circuits can be highly integrated.

Preferably, the aforementioned plurality of pairs of bit lines include a plurality of first pairs of bit lines and a plurality of second pairs of bit lines arranged in a folded structure. The plurality of first pairs of bit lines and the plurality of second pairs of bit lines are alternately arranged along the row direction. The sense latch circuit group and the data latch circuit groups corresponding to the respective ones of the first pairs of bit lines are aligned on one side of the plurality of first pairs of bit lines along the column direction. The sense latch circuit group and the data latch circuit groups corresponding to the respective ones of the second pairs of bit lines are aligned on one side of the plurality of second pairs of bit lines, opposite to the side of the plurality of first pairs of bit lines, along the column direction.

In the aforementioned nonvolatile semiconductor memory device, the overall circuits can be highly integrated while avoiding such a problem that the sense latch circuit group and the data latch circuit groups are concentrated to the central portion to cause difficulty in layout.

Preferably, the word line driver supplies the read voltages to the word line corresponding to a memory cell for rewriting data. The aforementioned write circuit erases data of the memory cell for rewriting data before supplying the write voltages.

The aforementioned nonvolatile semiconductor memory device can rewrite data with no operation processing employing the pairs of bit lines or the transistors in the memory cell array.

Preferably, the word line driver supplies a read voltage to the word line corresponding to a memory cell to be subjected to additional writing. The aforementioned nonvolatile semiconductor memory device further comprises an additional write data conversion circuit. The additional write data conversion circuit converts data latched by the data latch circuit groups when the read voltage is supplied and data to be written in the memory cell to be subjected to additional writing to data of ($2^n-1$) bits.

The aforementioned nonvolatile semiconductor memory device can perform additional writing with no operation processing employing the pairs of bit lines or the transistors in the memory cell array.

Preferably, the aforementioned nonvolatile semiconductor memory device further comprises a recovery read data conversion circuit. When data is incorrectly written in the memory cell, the recovery read data conversion circuit converts the data of ($2^n-1$) bits latched by the data latch circuit groups to data of n bits.

The aforementioned nonvolatile semiconductor memory device can perform recovery reading with no operation processing employing the pairs of bit lines or the transistors in the memory cell array.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail with reference to the drawings. In the drawings, identical or corresponding parts are denoted by the same reference numerals, and redundant description is not repeated.

[First Embodiment]

Figure 1:
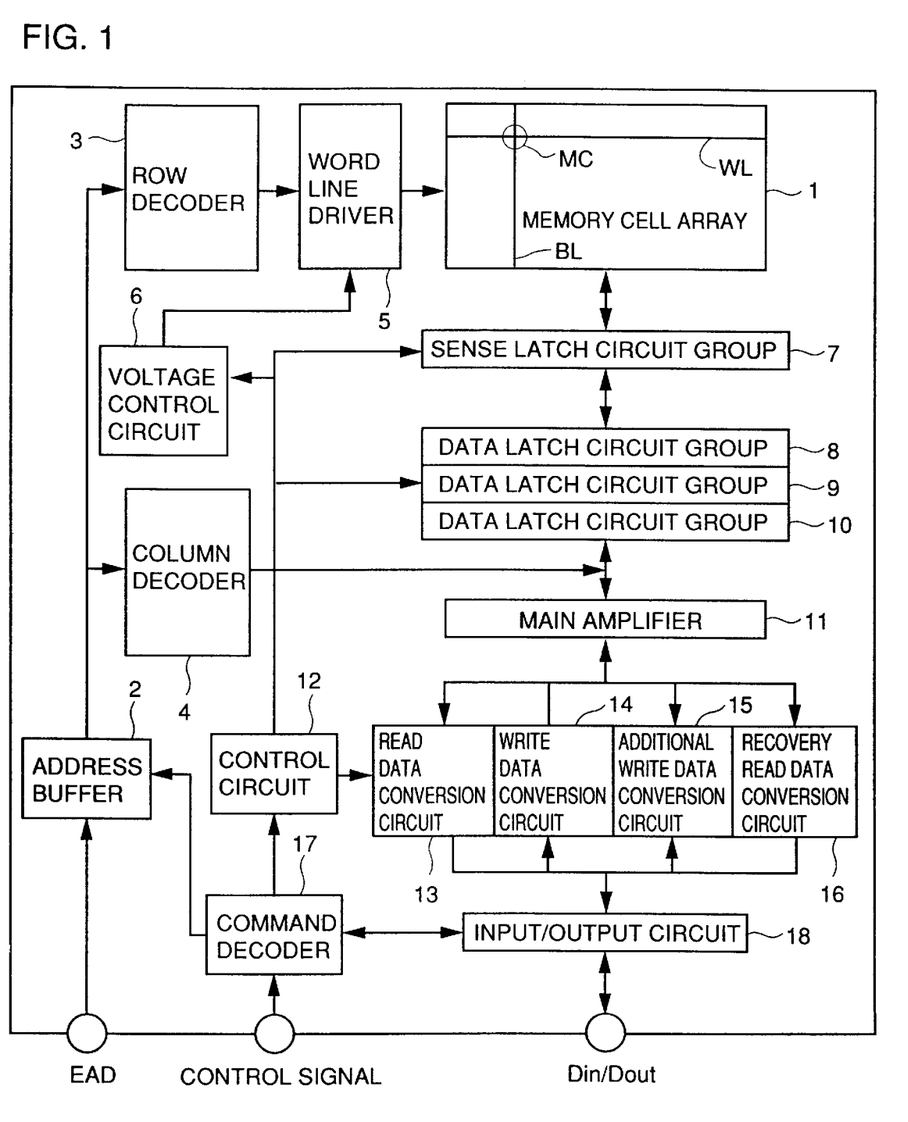
FIG. 1 is a block diagram showing the overall structure of a flash memory according to a first embodiment of the present invention.

FIG. 1 is a block diagram showing the overall structure of a flash memory according to a first embodiment of the present invention. Referring to FIG. 1, this flash memory is a multilevel storage flash memory storing data of two bits (four levels) in a single memory cell, including a memory cell array 1, an address buffer 2, a row decoder 3, a column decoder 4, a word line driver 5, a voltage control circuit 6, a sense latch circuit group 7, data latch circuit groups 8 to 10, a main amplifier circuit 11, a control circuit 12, a read data conversion circuit 13, a write data conversion circuit 14, an additional write data conversion circuit 15, a recovery read data conversion circuit 16, a command decoder 17 and a data input/output circuit 18.

The memory cell array includes a plurality of memory cells MC arranged in rows and columns, a plurality of word lines WL arranged in rows and a plurality of pairs of bit lines BL arranged in columns. FIG. 1 representatively shows a single memory cell MC, a single word line W and a single bit line BL. The address buffer 2 generates an internal address signal in response to an external address signal EAD. The row decoder 3 selects the corresponding row (word line) in response to the internal address signal. The column decoder 4 selects the corresponding column in response to the internal address signal. The word line diver 5 supplies voltages from the voltage control circuit 6 to the word line selected by the row decoder 3. The voltage control circuit 6 selectively supplies read voltages VRD1 to VRD3 to the word line driver 5. The sense latch circuit group 7 latches data read on the pairs of bit lines BL. The sense latch circuit group 7 includes a plurality of sense latch circuits provided in correspondence to the plurality of pairs of bit lines BL. The data latch circuit groups 8 to 10 latch data from the sense latch circuit group 7 or the main amplifier circuit 11. The data latch circuit groups 8 to 10 include a plurality of data latch circuits provided in correspondence to the plurality of sense latch circuits for latching data from the sense latch circuits. The main amplifier circuit 11 amplifies data from the data latch circuit groups 8 to 10 and transmits the amplified data to the read data conversion circuit 13 or the recovery read data conversion circuit 16, while amplifying data from the write data conversion circuit 14 or the additional write data conversion circuit 15 and transmitting the amplified data to the data latch circuit groups 8 to 10. The control circuit 12 controls the voltage control circuit 6, the sense latch circuit group 7, the read data conversion circuit 13, the write data conversion circuit 14, the additional write data conversion circuit 15 and the recovery read data conversion circuit 16. The read data conversion circuit 13 converts data of three bits from the sense latch circuit group 8 to 10 to read data of two bits. The write data conversion circuit 14 converts write data of two bits to data of three bits. The command decoder 17 supplies read, write and erase command signals to the address buffer 2, the control circuit 12 and the data input/output circuit 18 in response to an external control signal. The data input/output circuit 18 outputs read data Dout from the conversion circuits 13 and 16 and inputs write data Din in the conversion circuits 14 and 15.

Figure 2:
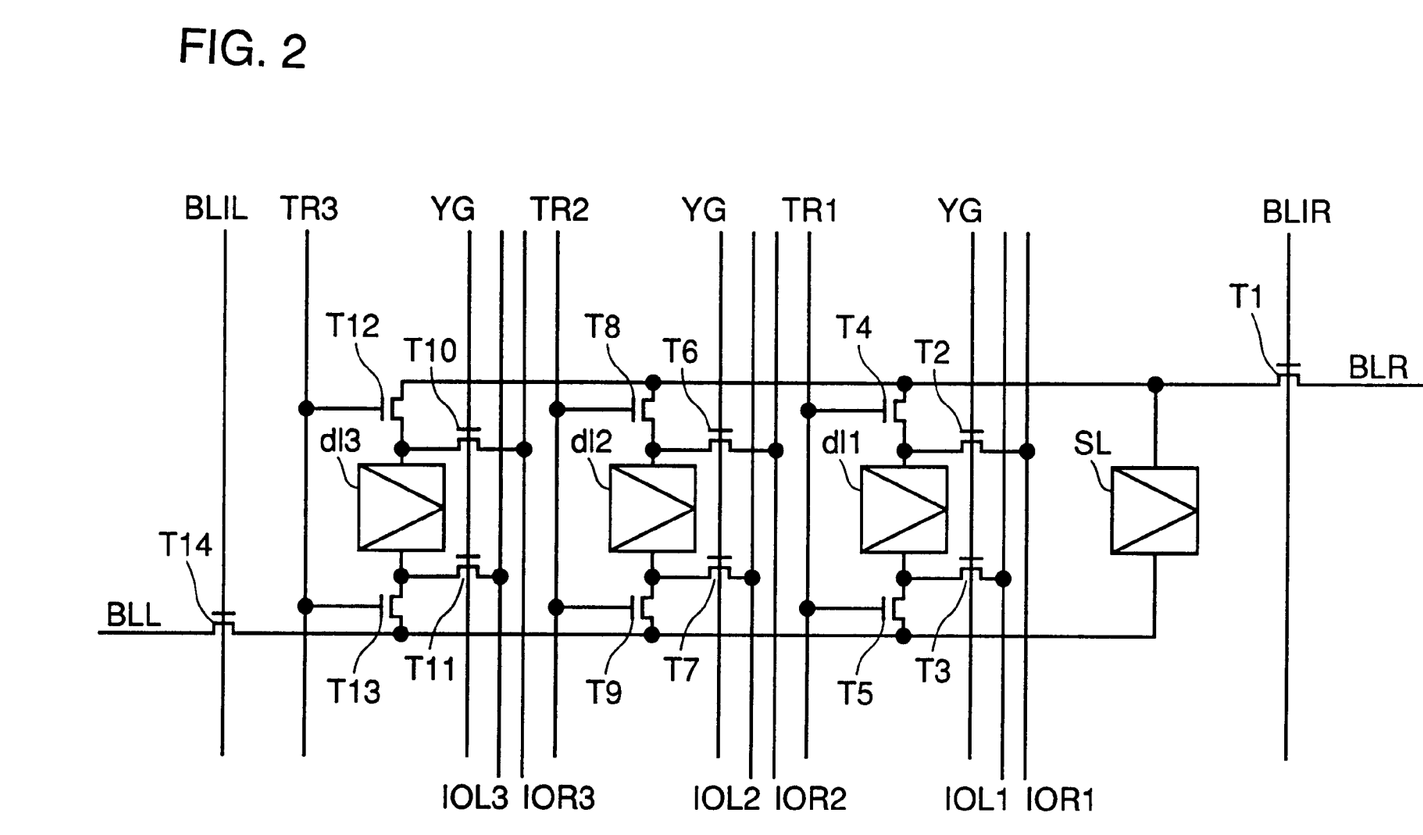
FIG. 2 illustrates arrangement of a memory cell array, a sense latch circuit group and data latch circuit groups shown in FIG. 1.

FIG. 2 illustrates the structures of a sense latch circuit SL and data latch circuits dl1 to dl3 provided in correspondence to each of the plurality of pairs of bit lines BL shown in FIG. 1. Referring to FIG. 2, the pair of bit lines, arranged in an open structure, are formed by a bit line BLR arranged on one side of the sense latch circuit SL along the column direction and a bit line BLL arranged on another side. The pair of bit lines BLR and BLL are thus arranged in an open structure, and hence the sense latch circuit SL and the data latch circuits dl1 to dl3 can be adjacently aligned with each other along the column direction. The sense latch circuit SL is connected with the bit line BLR through a transistor T1, and connected with the bit line BLL through a transistor T14. The data latch circuit dl1 is arranged adjacently to the sense latch circuit SL, and connected with the sense latch circuit SL through transistors T4 and T5. The data latch circuit dl1 is further connected with an input/output line IOR1 through a transistor T2, and connected with an input/output line IOL1 through a transistor T3. The data latch circuit dl2 is arranged adjacently to the data latch circuit dl1, and connected with the sense latch circuit SL through transistors T8 and T9. The data latch circuit dl2 is further connected with an input/output line IOR2 through a transistor T6, and connected with an input/output line IOL2 through a transistor T7. The data latch circuit dl3 is arranged adjacently to the data latch circuit dl2, and connected with the sense latch circuit SL through transistors T12 and T13. The data latch circuit dl3 is further connected with an input/output line IOR3 through a transistor T10, and connected with an input/output line IOL3 through a transistor T11. The transistor T1 is turned on/off in response to a signal BLIR. The transistor T14 is turned on/off in response to a signal BLIL. The transistors T2, T3, T6, T7, T10 and T11 are turned on/off in response to a signal YG. The transistors T4 and T5 are turned on/off in response to a signal TR1. The transistors T8 and T9 are turned on/off in response to a signal TR2. The transistors T12 and T13 are turned on/off in response to a signal TR3.

Figure 3:
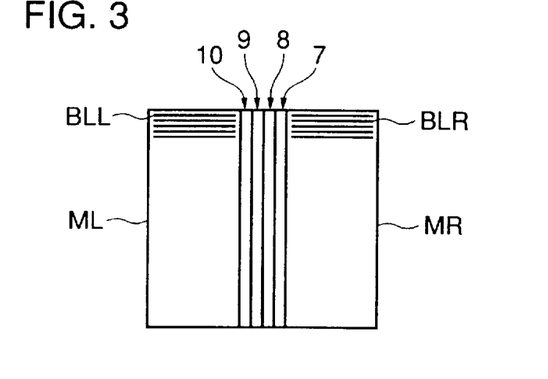
FIG. 3 illustrates arrangement of the memory cell array, the sense latch circuit group and the data latch circuit groups shown in FIGS. 1 and 2.

FIG. 3 shows the arrangement of the memory cell array 1, the sense latch circuit group 7 and the data latch circuit groups 8 to 10 shown in FIGS. 1 and 2. As hereinabove described, the plurality of pairs of bit lines BL of the memory cell array 1 are arranged in an open structure. In other words, a single pair of bit lines are formed by a bit line BLR arranged on one side of the corresponding sense latch circuit included in the sense latch circuit group 7 along the column direction and a bit line BLL arranged on the other side along the column direction. The memory cell array 1 is split into memory mats MR and ML. The memory mat MR includes a plurality of word lines WL arranged in rows, a plurality of bit lines BLR arranged in columns and a plurality of memory cells arranged in rows and columns. The memory mat ML includes a plurality of word lines WL arranged in rows, a plurality of bit lines BLL arranged in columns and a plurality of memory cells arranged in rows and columns. The plurality of sense latch circuits SL included in the sense latch circuit group 7 are aligned perpendicularly to the pairs of bit lines, i.e., along the row direction. Therefore, the sense latch group 7 is arranged perpendicularly to the bit lines BLR and BLL, as shown in FIG. 3. The plurality of data latch circuits dl1 included in the data latch circuit group 8 are aligned perpendicularly to the pairs of bit lines, i.e., along the row direction. Therefore, the data latch circuit group 8 is arranged adjacently to the sense latch circuit group 7 and perpendicularly to the bit lines BLR and BLL, as shown in FIG. 3. The plurality of data latch circuits dl2 included in the data latch circuit group 9 are aligned perpendicularly to the pairs of bit lines, i.e., along the row direction. Therefore, the data latch circuit group 9 is arranged adjacently to the data latch circuit group 8 and perpendicularly to the bit lines BLR and BLL, as shown in FIG. 3. The plurality of data latch circuits dl3 included in the data latch circuit group 10 are aligned perpendicularly to the pairs of bit lines, i.e., along the row direction. Therefore, the data latch circuit group 10 is arranged adjacently to the data latch circuit group 9 and perpendicularly to the bit lines BLR and BLL, as shown in FIG. 3.

According to the first embodiment, as hereinabove described, the pairs of bit lines are arranged in an open structure, whereby the sense latch circuit group 7 and the data latch circuit groups 8 to 10 can be adjacently arranged at the center. Thus, the overall circuits can be highly integrated. The order of the adjacent arrangement of the sense latch circuit group 7 and data latch circuit groups 8 to 10 is not restricted to that shown in FIG. 3.

[Second Embodiment]

In relation to a second embodiment of the present invention, description is made on readout of 2-bit data stored in a single memory cell in the flash memory according to the first embodiment.

Figure 4:
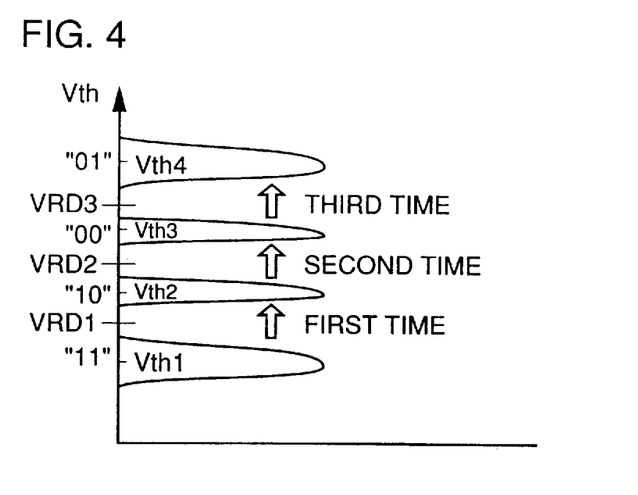
FIG. 4 shows the relation between 2-bit data stored in a memory cell, the threshold of the memory cell and read voltages.

FIG. 4 illustrates the relation between the 2-bit data stored in a memory cell, the threshold Vth of the memory cell and the read voltages VRD1 to VRD3. Writing/readout of the 2-bit data in/from the memory cell is now briefly described. Referring to FIG. 4, the memory cell is set to a threshold Vth1 for storing 2-bit data "11". For storing 2-bit data "10", the memory cell is set to a threshold Vth2. For storing 2-bit data "00", the memory cell is set to a threshold Vth3. For storing 2-bit data "01", the memory cell is set to a threshold Vth4. In other words, the 2-bit data "11" is written in the memory cell if the same has the threshold Vth1, the 2-bit data "10" is written in the memory cell if the same has the threshold Vth2, the 2-bit data "00" is written in the memory cell if the same has the threshold Vth3, and the 2-bit data "01" is written in the memory cell if the same has the threshold Vth4. It is assumed that the state where the 2-bit data "11" is written is an erase state. In order to read the data written in the memory cell in the aforementioned manner, the read voltages are supplied to the control gate of the memory cell. First, the read voltage VRD1 is supplied. If the data currently written in the memory cell is "11", the memory cell is turned on to change the voltage of a bit line. The sense latch circuit detects this change. If the data written in the memory cell is not "11", no current flows to the memory cell and the voltage of the bit line remains unchanged. Then, the read voltage VRD2 is supplied. If the data currently written in the memory cell is "11" or "10", the memory cell is turned on to change the voltage of the bit line. The sense latch circuit detects this change. If the data written in the memory cell is "00" or "01", no current flows to the memory cell and the voltage of the bit line remains unchanged. Then, the read voltage VRD3 is supplied. If the data currently written in the memory cell is "11", "10" or "00", the memory cell is turned on to change the voltage of the bit line. The sense latch circuit detects this change. If the data written in the memory cell is "01", no current flows to the memory cell and the voltage of the bit line remains unchanged. The data written in the memory cell is decided from the results of the supply of the three read voltages VRD1 to VRD3.

Figure 5:
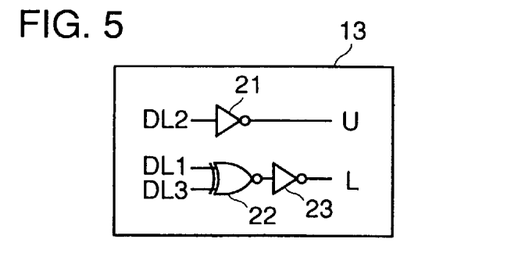
FIG. 5 is a block diagram showing the structure of a read data conversion circuit shown in FIG. 1.
Figure 6:
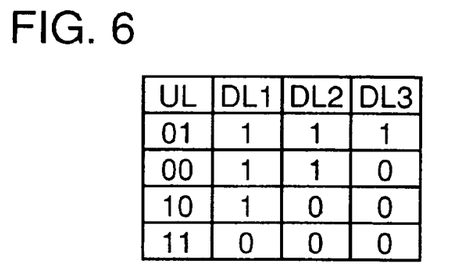
FIG. 6 illustrates the association between inputs and outputs of the read data conversion circuit.

FIG. 5 is a block diagram showing the structure of the read data conversion circuit 13 shown in FIG. 1. Referring to FIG. 5, the read data conversion circuit 13 includes invertors 21 and 23 and an EX-OR circuit 22. The invertor 21 inverts data DL2 latched by the data latch circuit dl1 and outputs the inverted data as upper bit data U. The EX-OR circuit 22 outputs the exclusive OR of data DL1 latched by the data latch circuit dl1 and data DL3 latched by the data latch circuit dl3. The invertor 23 inverts the output of the EX-OR circuit 22 and outputs the inverted data as lower bit data L. FIG. 6 shows the association between the inputs DL1 to DL3 and the outputs U and L of the read data conversion circuit 13.

Readout of 2-bit data stored in a single memory cell of the flash memory shown in FIGS. 1 to 3 is now described.

The following description is made with reference to the case of reading 2-bit data "00" stored in the memory cell. Referring to FIG. 3, it is assumed that the memory mat MR includes this memory cell.

Referring to FIG. 2, the bit line BLR is precharged to 1 V, and the bit line BLL is precharged to 0.5 V. The word line driver 5 shown in FIG. 1 supplies the read voltage VRD1 to the word line connected with the memory cell for reading data. The read data VRD1 has the magnitude shown in FIG. 4. Therefore, this memory cell is not turned on but the voltage of the bit line BLR shown in FIG. 2 remains 1 V. Referring to FIG. 2, the signals BLIR and BLIL are activated to turn on the transistors T1 and T14. The sense latch circuit SL latches data "1". The signals BLIR and BLIL are then inactivated to turn off the transistors T1 and T14. Then, the signal TR1 is activated to turn on the transistors T4 and T5. Thus, the data latch circuit dl1 latches the data "1" latched by the sense latch circuit SL. Thereafter the signal TR1 is inactivated to turn off the transistors T4 and T5.

Referring to FIG. 2, the bit line BLR is precharged to 1 V, and the bit line BLL is precharged to 0.5 V. Then, the word line driver 5 shown in FIG. 1 supplies the read voltage VRD2 to the word line connected with the memory cell for reading data. The read data VRD2 has the magnitude shown in FIG. 4. Therefore, this memory cell is not turned on but the voltage of the bit line BLR shown in FIG. 2 remains 1 V. Referring to FIG. 2, the signals BLIR and BLIL are activated to turn on the transistors T1 and T14. The sense latch circuit SL latches data "1". The signals BLIR and BLIL are then inactivated to turn off the transistors T1 and T14. Then, the signal TR2 is activated to turn on the transistors T8 and T9. Thus, the data latch circuit dl2 latches the data "1" latched by the sense latch circuit SL. Thereafter the signal TR2 is inactivated to turn off the transistors T8 and T9.

Referring to FIG. 2, the bit line BLR is precharged to 1 V, and the bit line BLL is precharged to 0.5 V. Then, the word line driver 5 shown in FIG. 1 supplies the read voltage VRD3 to the word line connected with the memory cell for reading data. The read data VRD3 has the magnitude shown in FIG. 4. Therefore, this memory cell is turned on and the voltage of the bit line BLR shown in FIG. 2 is reduced. Referring to FIG. 2, the signals BLIR and BLIL are activated to turn on the transistors T1 and T14. The sense latch circuit SL latches data "0". The signals BLIR and BLIL are then inactivated to turn off the transistors T1 and T14. Then, the signal TR3 is activated to turn on the transistors T12 and T13. Thus, the data latch circuit dl3 latches the data "0" latched by the sense latch circuit SL. Thereafter the signal TR3 is inactivated to turn off the transistors T12 and T13.

Referring to FIG. 2, the signal YG is then activated to turn on the transistors T2, T3, T6, T7, T10 and T11. The data latched by the data latch circuit dl1 is transmitted to the pair of input/output lines IOR1 and IOL1, the data latched by the data latch circuit dl2 is transmitted to the pair of input/output lines IOR2 and IOL2, and the data latched by the data latch circuit dl3 is transmitted to the pair of input/output lines IOR3 and IOL3. The main amplifier circuit 11 shown in FIG. 1 amplifies the data transmitted to the pairs of input/output lines IOR1 to IOR3 and IOL1 to IOL3 and transmits the amplified data to the read data conversion circuit 13. The data DL1, DL2 and DL3 input in the read data conversion circuit 13 are "1", "1" and "0" respectively, and hence the 2-bit data "00" is output to an output pad as output data Dout.

According to the second embodiment, as hereinabove described, the read data latched by the sense latch circuit SL are supplied to the data latch circuits dl1 to dl3 through no bit lines. Further, the read data conversion circuit 13 converts the data DL1 to DL3 latched by the data latch circuits dl1 to dl3 to read data of two bits. Thus, no operation processing may be performed through bit lines or transistors in the memory cell array, whereby the read time can be reduced to reduce power consumption.

When the number of levels of multilevel data is increased in the future for storing data of four bits or eight bits in a single memory cell, for example, the number of the data latch circuits may simply be increased.

[Third Embodiment]

In relation to a third embodiment of the present invention, description is made on writing of 2-bit data in a single memory cell in the flash memory according to the first embodiment.

Figure 7:
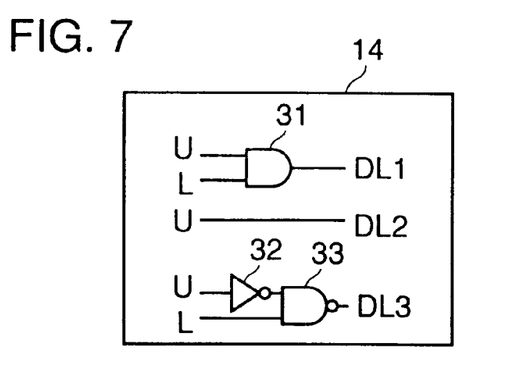
FIG. 7 is a block diagram showing the structure of a write data conversion circuit shown in FIG. 1.

FIG. 7 is a block diagram showing the structure of the write data conversion circuit 14 shown in FIG. 1. Referring to FIG. 7, the write data conversion circuit 14 includes an AND circuit 31, an inverter 32 and a NAND circuit 33. The AND circuit 31 outputs the AND of an upper bit U and a lower bit L of 2-bit data. The output of the AND circuit 31 is transmitted to the data latch circuit dl1. The invertor IV32 inverts the upper bit U of the 2-bit data. The NAND circuit 33 outputs the NAND of the output of the invertor 32 and the lower bit L of the 2-bit data. The output of the NAND circuit 33 is transmitted to the data latch circuit dl3. The write data conversion circuit 14 further transmits the upper bit U of the 2-bit data to the data latch circuit dl2.

Figure 8:
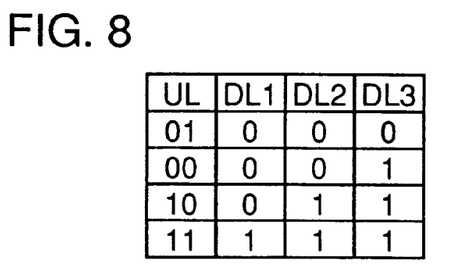
FIG. 8 shows the association between the upper bit and the lower bit of written 2-bit data and data transmitted to data latch circuits.

FIG. 8 shows the association between the upper bit U and the lower bit L of the written 2-bit data and the data DL1 to DL3 transmitted to the data latch circuits dl1 to dl3.

Data writing in the memory cell is now described. It is assumed that the memory mat MR shown in FIG. 3 is selected.

(1) The write data conversion circuit 14 converts externally input 2-bit data U and L to data DL1 to DL3 of three bits. The main amplifier circuit 11 amplifies the data DL1 to DL3, which in turn are input in and latched by the data latch circuits dl1 to dl3 from the sides of the input/output lines IOL1 to IOL3 shown in FIG. 2 respectively.

(2) The data DL1 latched by the data latch circuit dl1 is transmitted to and latched by the sense latch circuit SL.

(3) The level "10" is written in the bit line connected with the sense latch circuit SL having data "0".

(4) Whether or not the level "10" is written in the memory cell is verified. "1" is set in the sense latch circuit SL corresponding to the written memory cell, and the process returns to (3) when the sense latch circuit SL has the data "0".

(5) The sense latch circuit SL latches the data DL2 latched by the data latch circuit dl2.

(6) The level "00" is written in the bit line connected with the sense latch circuit SL having data "0".

(7) Whether or not the level "00" is written in the memory cell is verified. "1" is set in the written memory cell, and the process returns to (6) when the sense latch circuit SL has the data "0".

(8) The sense latch circuit SL latches the data DL3 latched by the data latch circuit dl3.

(9) The level "01" is written in the bit line connected with the sense latch circuit SL having data "0".

(10) Whether or not the level "01" is written in the memory cell is verified. "1" is set in the sense latch circuit SL for the written memory cell, and the process returns to (9) when the sense latch circuit SL has the data "0".

According to the third embodiment, as hereinabove described, the write data conversion circuit 14 and the data latch circuits dl1 to dl3 are provided for writing 2-bit data in the memory cell with no operation processing through bit lines or transistors in the memory cell array. Therefore, the write time can be reduced for reducing power consumption.

When the number of levels of multilevel data is increased in the future for storing data of four bits or eight bits in a single memory cell, for example, the number of the data latch circuits may simply be increased.

[Fourth Embodiment]

In relation to a fourth embodiment of the present invention, description is made on rewriting of data of a memory cell in the flash memory according to the first embodiment. It is assumed that the memory mat MR shown in FIG. 3 is selected.

(1) Data are read from the memory cell on the data latch circuits dl1 to dl3, similarly to the second embodiment.

(2) Externally input data are written in addresses of the data latch circuits dl1 to dl3 by write operation processing.

(3) The data of the memory cell are erased.

(4) Each level is written in the memory cell similarly to the third embodiment.

According to the fourth embodiment, as hereinabove described, data can be rewritten with no operation processing through bit lines or transistors in the memory cell array. Therefore, the read time can be reduced for reducing power consumption.

When the number of levels of multilevel data is increased in the future for storing data of four bits or eight bits in a single memory cell, for example, the number of the data latch circuits may simply be increased.

[Fifth Embodiment]

In relation to a fifth embodiment of the present invention, additional writing in the flash memory according to the first embodiment is described.

Figure 9:
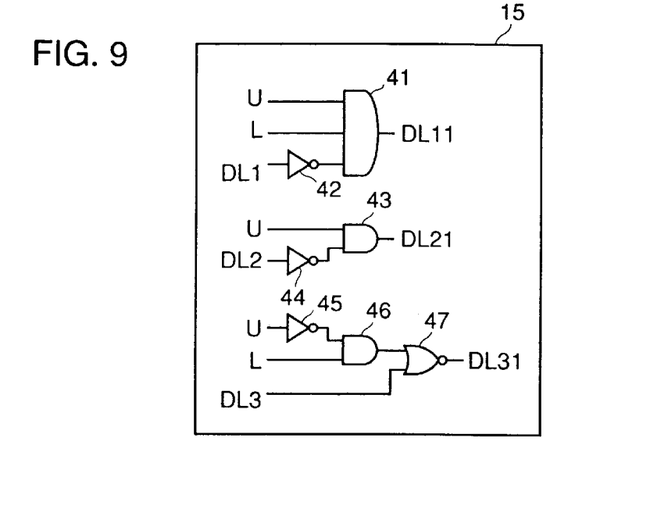
FIG. 9 is a block diagram showing the structure of an additional write data conversion circuit shown in FIG. 1.

FIG. 9 is a block diagram showing the structure of the additional write data conversion circuit 15 shown in FIG. 1. Referring to FIG. 9, the additional write data conversion circuit 15 includes AND circuits 41, 43 and 46, inverters 42, 44 and 45 and a NOR circuit 47. The invertor 42 inverts the data DL1 latched by the data latch circuit dl1. The AND circuit 41 outputs the AND of the upper bit U and the lower bit L of the 2-bit data and the output of the inverter 42. The output of the AND circuit 41 defines data DL11. The invertor 44 inverts the data DL2 latched by the data latch circuit dl2. The AND circuit 43 outputs the AND of the upper bit U of the 2-bit data and the output of the inverter 44. The output of the AND circuit 43 defines data DL21. The inverter 45 inverts the upper bit U of the 2-bit data. The AND circuit 46 outputs the AND of the output of the inverter 45 and the lower bit L of the 2-bit data. The NOR circuit 47 outputs the NOR of the output of the AND circuit 46 and the data DL3 latched by the data latch circuit dl3. The output of the NOR circuit 47 defines data DL31.

Figure 10:
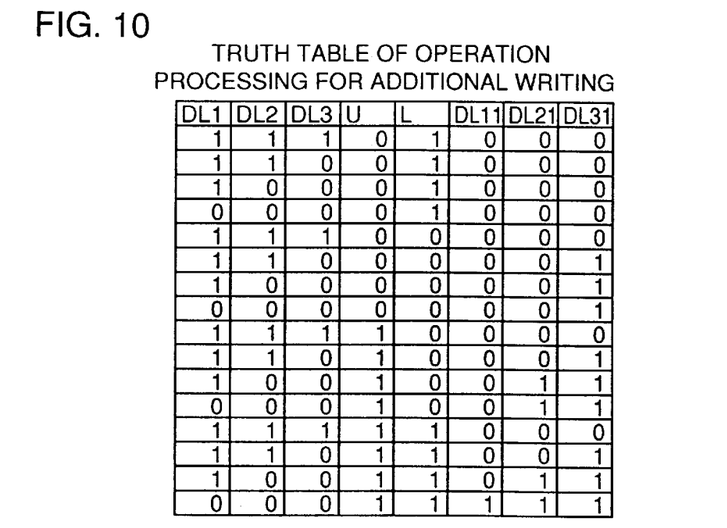
FIG. 10 illustrates the association between data latched by data latch circuits, the upper bits and the lower bits of 2-bit data and output data.

FIG. 10 shows the association between the data DL1 to DL3 latched by the data latch circuits dl1 to dl3, the upper bit U and the lower bit L of the 2-bit data and the output data DL11 to DL31.

Additional writing in the memory cell is now described. It is assumed that the memory mat MR shown in FIG. 3 is selected.

(1) Data are read on the data latch circuits dl1 to dl3, similarly to the second embodiment.

(2) The additional write data conversion circuit 15 performs operation processing on the basis of the data DL1 to DL3 latched by the data latch circuits dl1 to dl3 and the upper bit U and the lower bit L of the input 2-bit data, and generates the data DL11 to DL31.

(3) The data latch circuits dl1, dl2 and dl3 latch the data DL11, DL21 and DL31 respectively.

(4) The data of the memory cell are weakly erased.

(5) Each level is written in the memory cell similarly to the third embodiment.

According to the fifth embodiment, as hereinabove described, additional writing can be performed with no operation processing through bit lines or transistors in the memory cell array. Therefore, the read time can be reduced for reducing power consumption.

When the number of levels of multilevel data is increased in the future for storing data of four bits or eight bits in a single memory cell, for example, the number of the data latch circuits may simply be increased.

[Sixth Embodiment]

In relation to a sixth embodiment of the present invention, recovery reading in the flash memory according to the first embodiment is described.

Figure 11:
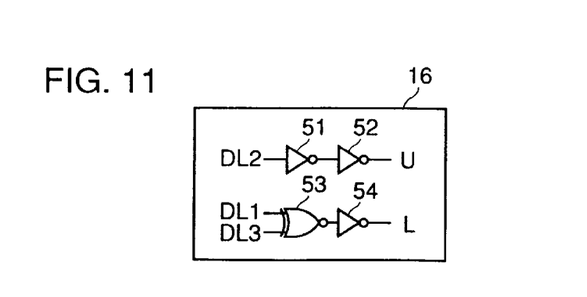
FIG. 11 is a block diagram showing the structure of a recovery read data conversion circuit shown in FIG. 1.

FIG. 11 is a block diagram showing the structure of the recovery read data conversion circuit 16 shown in FIG. 1. Referring to FIG. 11, the recovery read conversion circuit 16 includes inverters 51, 52 and 54 and an EX-OR circuit 53. The inverter 51 inverts the data DL2 latched by the data latch circuit dl2. The inverter 52 inverts the output of the inverter 51. The output of the inverter 52 defines the upper bit U of the 2-bit data. The EX-OR circuit 53 outputs the exclusive-OR of the data DL1 latched by the data latch circuit dl1 and the data DL3 latched by the data latch circuit dl3. The inverter 54 inverts the output of the EX-OR circuit 54. The output of the inverter 54 defines the lower bit L of the 2-bit data.

Recovery reading is now described. It is assumed that the memory mat MR shown in FIG. 3 is selected.

When a write error occurs, the data DL1 to DL3 latched by the data latch circuits dl1 to dl3 are input in the aforementioned recovery read data conversion circuit 16 for performing operation processing and outputting resulting 2-bit data to the output pad.

According to the sixth embodiment, as hereinabove described, recovery reading can be performed with no operation processing through bit lines or transistors in the memory cell array. Therefore, the read time can be reduced for reducing power consumption.

When the number of levels of multilevel data is increased in the future for storing data of four bits or eight bits in a single memory cell, for example, the number of the data latch circuits may simply be increased.

[Seventh Embodiment]

In the structures shown in FIGS. 2 and 3, the plurality of sense latch circuits SL and the plurality of data latch circuits dl1, dl2 and dl3 are concentrated to the central portion to cause difficulty in layout. An object of a seventh embodiment of the present invention is to solve this problem.

Figure 12:
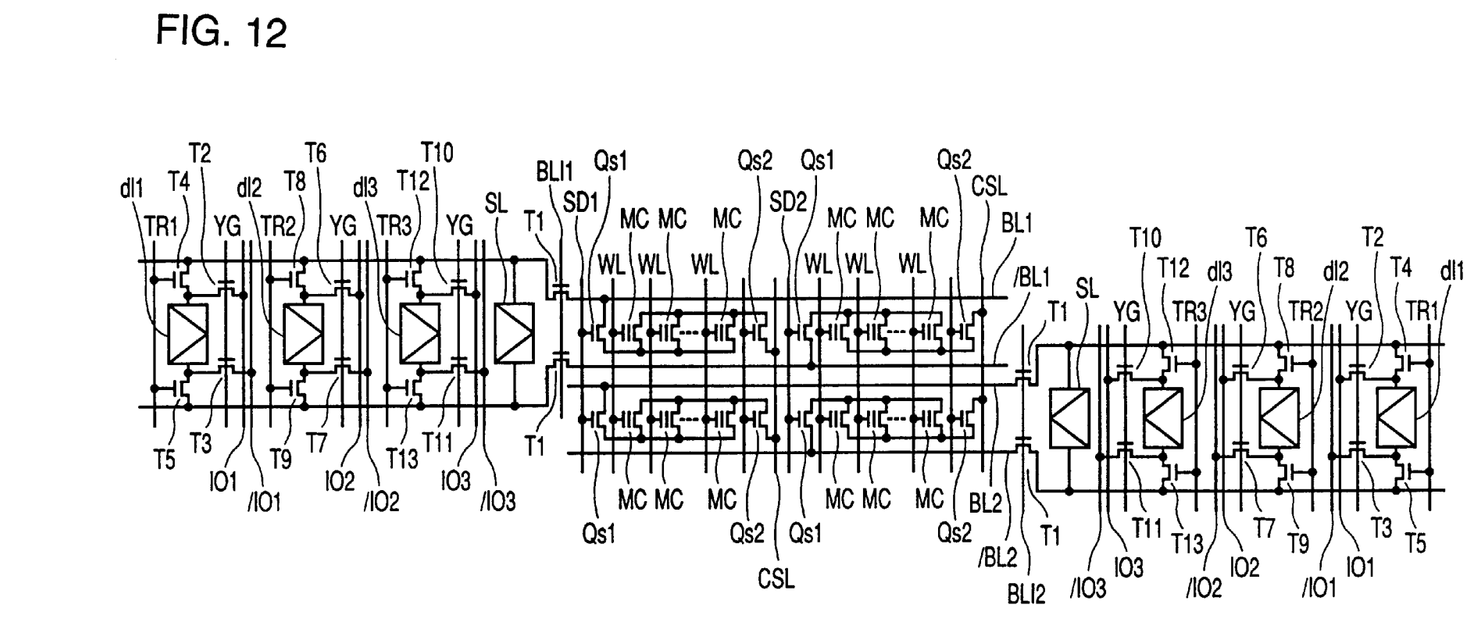
FIG. 12 illustrates the structures of a sense latch circuit and data latch circuits provided in correspondence to each of a plurality of pairs of bit lines according to a seventh embodiment of the present invention.

FIG. 12 illustrates the structures of a sense latch circuit SL and data latch circuits dl1 to dl3 provided in correspondence each of a plurality of pairs of bit lines according to the seventh embodiment. Referring to FIG. 12, the plurality of pairs of bit lines include a plurality of pairs of bit lines BL1 and /BL1 and BL2 and /BL2 arranged in a folded structure. While FIG. 12 shows only a pair of bit lines BL1 and /BL1 and another pair of bit lines BL2 and /BL2, a plurality of pairs of bit lines BL1 and /BL1 and a plurality of pairs of bit lines BL2 and /BL2 are alternately arranged along a row direction in practice. A sense latch circuit SL and data latch circuits dl1 to dl3 are provided in correspondence to each of the plurality of pairs of bit lines BL1 and /BL1. These circuits are aligned on one side of the pair of bit lines BL1 and /BL1 along a column direction. Another sense latch circuit SL and data latch circuits dl1 to dl3 are provided in correspondence to each of the plurality of pairs of bit lines BL2 and /BL2. These circuits are aligned on one side of the pair of bit lines BL2 and /BL2, opposite to the side provided with the sense latch circuit SL and the data latch circuits dl1 to dl3 in correspondence to the pair of bit lines BL1 and /BL1, along the column direction.

The connection of the sense latch circuit SL and the data latch circuits dl1 to dl3 provided in correspondence to the pair of bit lines BL1 and /BL1 is now described.

The sense latch circuit SL is connected with the pair of bit lines BL1 and /BL1 through transistors T1. The data latch circuit dl3 is arranged adjacently to the sense latch circuit SL, and connected with the sense latch circuit SL through transistors T12 and T13. The data latch circuit dl3 is further connected with an input/output line IO3 through a transistor T10, and connected with an input/output line /IO3 through a transistor T11. The data latch circuit dl2 is arranged adjacently to the data latch circuit dl3, and connected with the sense latch circuit SL through transistors T8 and T9. The data latch circuit dl2 is further connected with an input/output line IO2 through a transistor T6, and connected with an input/output line /IO2 through a transistor T7. The data latch circuit dl1 is arranged adjacently to the data latch circuit dl2, and connected with the sense latch circuit SL through transistors T4 and T5. The data latch circuit dl1 is further connected with an input/output line IO1 through a transistor T2, and connected with an input/output line /IO1 through a transistor T3. The transistor T1 is turned on/off in response to a signal BLI1. The transistors T2, T3, T6, T7, T10 and T11 are turned on/off in response to a signal YG. The transistors T4 and T5 are turned on/off in response to a signal TR1. The transistors T8 and T9 are turned on/off in response to a signal TR2. The transistors T12 and T13 are turned on/off in response to a signal TR3.

The connection of the sense latch circuit SL and the data latch circuits dl1 to dl3 provided in correspondence to the pair of bit lines BL2 and /BL2 is similar to that related to the pair of bit lines BL1 and /BL1.

A plurality of memory cells MC of a parallel mode having sources and drains connected in common are arranged for each of the pairs of bit lines BL1, /BL1, BL2 and /BL2 along the column direction. The drains, connected in common, of the plurality of memory cells MC of a parallel mode are connected with the corresponding bit line through transistors Qs1. The sources, connected in common, are connected with a ground point or a negative voltage through transistors Qs2.

According to the seventh embodiment, as hereinabove described, the plurality of pairs of bit lines BL1, /BL1, BL2 and /BL2 are alternately arranged along the row direction in a folded structure. In correspondence to each of the plurality of pairs of bit lines BL1 and /BL1, the sense latch circuit SL and the data latch circuits dl1 to dl3 are aligned on one side of the pair of bit lines BL1 and /BL1 along the column direction. In correspondence to each of the plurality of pairs of bit lines BL2 and /BL2, the sense latch circuit SL and the data latch circuits dl1 to dl3 are aligned on one side of the pair of bit lines BL2 and /BL2, opposite to that provided with the sense latch circuit SL and the data latch circuits dl1 to dl3 in correspondence to the pair of bit lines BL1 and /BL1, along the column direction.

Therefore, the overall circuits can be highly integrated while avoiding such a problem that the plurality of sense latch circuits SL and the plurality of data latch circuits dl1, dl2 and dl3 are concentrated to the central portion to cause difficulty in layout.

Also in a flash memory having the aforementioned structure, operations such as readout, writing, rewriting, additional writing and recovery reading can be performed with no operation processing through bit lines or transistors in a memory cell array, similarly to the second to sixth embodiments.

While each of the first to seventh embodiments has been described with reference to a quadrilevel flash memory storing data of two bits in a single memory cell, the present invention is applicable to a $2^n$-level nonvolatile semiconductor memory device storing data of n (n: integer of at least two) bits in a single memory cell. An octalevel memory storing data of three bits in a single memory may be provided with seven data latch circuit groups, and a 16-level memory storing data of four bits in each memory cell may be provided with 15 data latch circuit groups. In short, a $2^n$-level memory storing data of n bits in a single memory cell may be provided with ($2^n-1$) data latch circuit groups.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a memory cell array having a plurality of memory cells, arranged in rows and columns, each storing data of n bits, where n is integer of at least two;

a plurality of word lines arranged in the rows, each connected with a control gate of a memory cell arranged on a corresponding row;

a plurality of pairs of bit lines, arranged in the columns, each connected with a drain of a memory cell arranged on a corresponding column;

a word line driver selectively supplying ($2^n-1$) types of read voltages to said word lines in reading;

a sense latch circuit group latching data of said plurality of pairs of bit lines;

($2^n-1$) data latch circuit groups each latching said data latched by said sense latch circuit group when said word line driver supplies corresponding one of said ($2^n-1$) types of read voltages to said word lines; and a read data conversion circuit converting said data latched by said data latch circuit groups to said data of n bits and reading said data of n bits.

2. The nonvolatile semiconductor memory device according to claim 1, further comprising:

a write data conversion circuit converting data to be written in said memory cells to data of ($2^n-1$) bits indicating whether or not to supply ($2^n-1$) types of write voltages, wherein said ($2^n-1$) data latch circuit groups latch said data of ($2^n-1$) bits respectively, said nonvolatile semiconductor memory device further comprising:

a write circuit supplying said ($2^n-1$) types of write voltages to said memory cells in response to said data latched by said ($2^n-1$) data latch circuit groups.

3. The nonvolatile semiconductor memory device according to claim 2, wherein said write circuit supplies said ($2^n-1$) types of write voltages sequentially from the lower side.

4. The nonvolatile semiconductor memory device according to claim 1, wherein said plurality of pairs of bit lines are arranged in an open manner, said sense latch circuit group is aligned perpendicularly to said plurality of pairs of bit lines, said data latch circuit groups are aligned perpendicularly to said plurality of pairs of bit lines, and said sense latch circuit group and said data latch circuit groups are adjacent to each other.

5. The nonvolatile semiconductor memory device according to claim 1, wherein said plurality of pairs of bit lines include a plurality of first pairs of bit lines and a plurality of second pairs of bit lines arranged in a folded manner, said plurality of first pairs of bit lines and said plurality of second pairs of bit lines are alternately arranged along the row direction, said sense latch circuit group and said data latch circuit groups corresponding to each of said first pairs of bit lines are aligned on one side of said plurality of first pairs of bit lines along the column direction, and said sense latch circuit group and said data latch circuit groups corresponding to each of said second pairs of bit lines are aligned on one side of said plurality of second pairs of bit lines, opposite to said one side of said plurality of first pairs of bit lines, along the column direction.

6. The nonvolatile semiconductor memory device according to claim 2, wherein said word line driver supplies said read voltages to a word line corresponding to a memory cell for rewriting said data, and said write circuit erases said data of said memory cell for rewriting said data before supplying said write voltages.

7. The nonvolatile semiconductor memory device according to claim 2, wherein said word line driver supplies said read voltages to a word line corresponding to a memory cell to be subjected to additional writing, said nonvolatile semiconductor memory device further comprising:

an additional write data conversion circuit converting said data latched by said data latch circuit groups when said read voltages are supplied and said data to be written in said memory cell to be subjected to additional writing to said data of ($2^n-1$) bits.

8. The nonvolatile semiconductor memory device according to claim 2, further comprising:

a recovery read data conversion circuit converting said data of ($2^n-1$) bits latched by said data latch circuit groups to said data of n bits when data is incorrectly written in said memory cells.

* * * * *